(12) United States Patent
Wang et al.

(10) Patent No.: US 9,978,751 B2
(45) Date of Patent: May 22, 2018

(54) SEMICONDUCTOR STRUCTURE

(71) Applicant: MEDIATEK INC., Hsin-Chu (TW)

(72) Inventors: Yu-Jen Wang, Hsinchu (TW); Kuo-En Huang, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days. days.

(21) Appl. No.: 15/493,199

(22) Filed: Apr. 21, 2017

(65) Prior Publication Data

US 2017/0338231 A1   Nov. 23, 2017

Related U.S. Application Data (60) Provisional application No. 62/339,123, filed on May 20, 2016, provisional application No. 62/382,288, filed on Sep. 1, 2016.

(51) Int. Cl.
| | |
|---|---|
| *H01L 27/092* | (2006.01) |
| *H01L 29/06* | (2006.01) |
| *H01L 29/78* | (2006.01) |
| *H01L 29/66* | (2006.01) |
| *H01L 27/02* | (2006.01) |

(52) U.S. Cl.
CPC ...... *H01L 27/0924* (2013.01); *H01L 27/0207* (2013.01); *H01L 29/0619* (2013.01); *H01L 29/0649* (2013.01); *H01L 29/6681* (2013.01); *H01L 29/785* (2013.01)

(58) Field of Classification Search
CPC .............. H01L 27/0924; H01L 29/785; H01L 29/0619; H01L 29/6681; H01L 27/0207; H01L 29/0649; H01L 29/66143; H01L 29/0657; H01L 29/872; H01L 29/0623; H01L 29/7811; H01L 29/7823
See application file for complete search history.

(56) References Cited

U.S. PATENT DOCUMENTS

| | | | |
|---|---|---|---|
| 9,324,827 B1* | 4/2016 | Singh | ............ H01L 29/785 |
| 9,799,770 B2* | 10/2017 | Lin | ............ H01L 29/7851 |
| 2013/0062723 A1* | 3/2013 | Henning | ............ H01L 29/8611 257/484 |
| 2013/0200449 A1 | 8/2013 | Chen | |
| 2014/0306296 A1 | 10/2014 | Jeon et al. | |

(Continued)

FOREIGN PATENT DOCUMENTS

EP   3136444 A1   3/2017

*Primary Examiner* — Earl Taylor
(74) *Attorney, Agent, or Firm* — McClure, Qualey & Rodack, LLP (57) ABSTRACT

A semiconductor structure is provided. The semiconductor structure includes a semiconductor substrate, a well region on the semiconductor substrate, a radio frequency circuit, a first guard ring adjacent to the RF circuit, and a first isolation region directly disposed between the RF circuit and the first guard ring. The well region has a first conductive type. The RF circuit includes a FIN field-effect transistor having a plurality of first fins and a plurality of first polys on the well region, wherein the first polys are perpendicular to the first fins. The first guard ring includes a plurality of second fins and a pair of second polys on the well region, wherein the second polys are perpendicular to the second fins. The first fins are arranged parallel to the second fins, and the first fins are separated from the second fins by the first isolation region.

20 Claims, 6 Drawing Sheets

(56) References Cited

U.S. PATENT DOCUMENTS

| | | | |
|---|---|---|---|
| 2014/0367780 A1* | 12/2014 | Hong | H01L 29/785 |
| | | | 257/347 |
| 2016/0013187 A1 | 1/2016 | Zhong et al. | |
| 2016/0118473 A1* | 4/2016 | Singh | H01L 29/785 |
| | | | 257/484 |
| 2016/0211262 A1* | 7/2016 | Jan | H01L 21/823821 |
| 2017/0338231 A1* | 11/2017 | Wang | H01L 27/0924 |

* cited by examiner

SEMICONDUCTOR STRUCTURE

CROSS REFERENCE TO RELATED APPLICATIONS

This application claims the benefit of U.S. Provisional Application No. 62/339,123, filed on May 20, 2016, and U.S. Provisional Application No. 62/382,288, filed on Sep. 1, 2016, the entireties of which are incorporated by reference herein.

BACKGROUND OF THE INVENTION

Field of the Invention

The invention relates to a semiconductor structure, and more particularly to a semiconductor structure of a guard ring for a radio frequency (RF) device.

Description of the Related Art

Semiconductor device manufacturers are tasked to deliver products that perform with an expected level of quality. In an integrated circuit (IC), one circuit or device will introduce noise that interferes with the operation of other circuits or devices in the IC. This introduction of noise often degrades the performance of the IC.

Guard rings are used as isolation regions between devices or circuits within an IC. Guard rings surround the devices or circuits of the IC in order to reduce interference or noise between adjacent devices or circuits. Guard rings are more important for high-frequency circuits (such as radio frequency (RF) circuits) that are susceptible to interference and noise.

BRIEF SUMMARY OF THE INVENTION

Semiconductor structures are provided. An embodiment of a semiconductor structure is provided. The semiconductor structure comprises a semiconductor substrate, a well region on the semiconductor substrate, a radio frequency (RF) circuit, a first guard ring adjacent to the RF circuit, and a first isolation region directly disposed between the RF circuit and the first guard ring. The well region has a first conductive type. The RF circuit comprises at least one FIN field-effect transistor having a plurality of first fins and a plurality of first polys on the well region, wherein the first polys are perpendicular to the first fins. The first guard ring comprises a plurality of second fins and a pair of second polys on the well region, wherein the second polys are perpendicular to the second fins. The first fins are arranged parallel to the second fins, and the first fins are separated from the second fins by the first isolation region.

Furthermore, another embodiment of a semiconductor structure is provided. The semiconductor substrate comprises a semiconductor substrate, a well region on the semiconductor substrate, a radio frequency (RF) circuit, a pair of guard rings disposed on both opposite sides of the RF circuit, a first isolation region on the well region, and a second isolation region on the well region. The well region has a first conductive type. The RF circuit comprises at least one FIN field-effect transistor having a plurality of first fins and a plurality of first polys on the well region, wherein the first fins have a second conductive type, and the first polys are perpendicular to the first fins. Each of the guard rings comprises a plurality of second fins and a pair of second polys on the well region, wherein the second fins have the first conductive type, and the second polys are perpendicular to the second fins. The first isolation region is directly disposed between the RF circuit and one of the guard rings. The second isolation region is directly disposed between the RF circuit and the other guard ring. The first fins are arranged parallel to the second fins, and the first fins are separated from the second fins by the first and second isolation regions.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
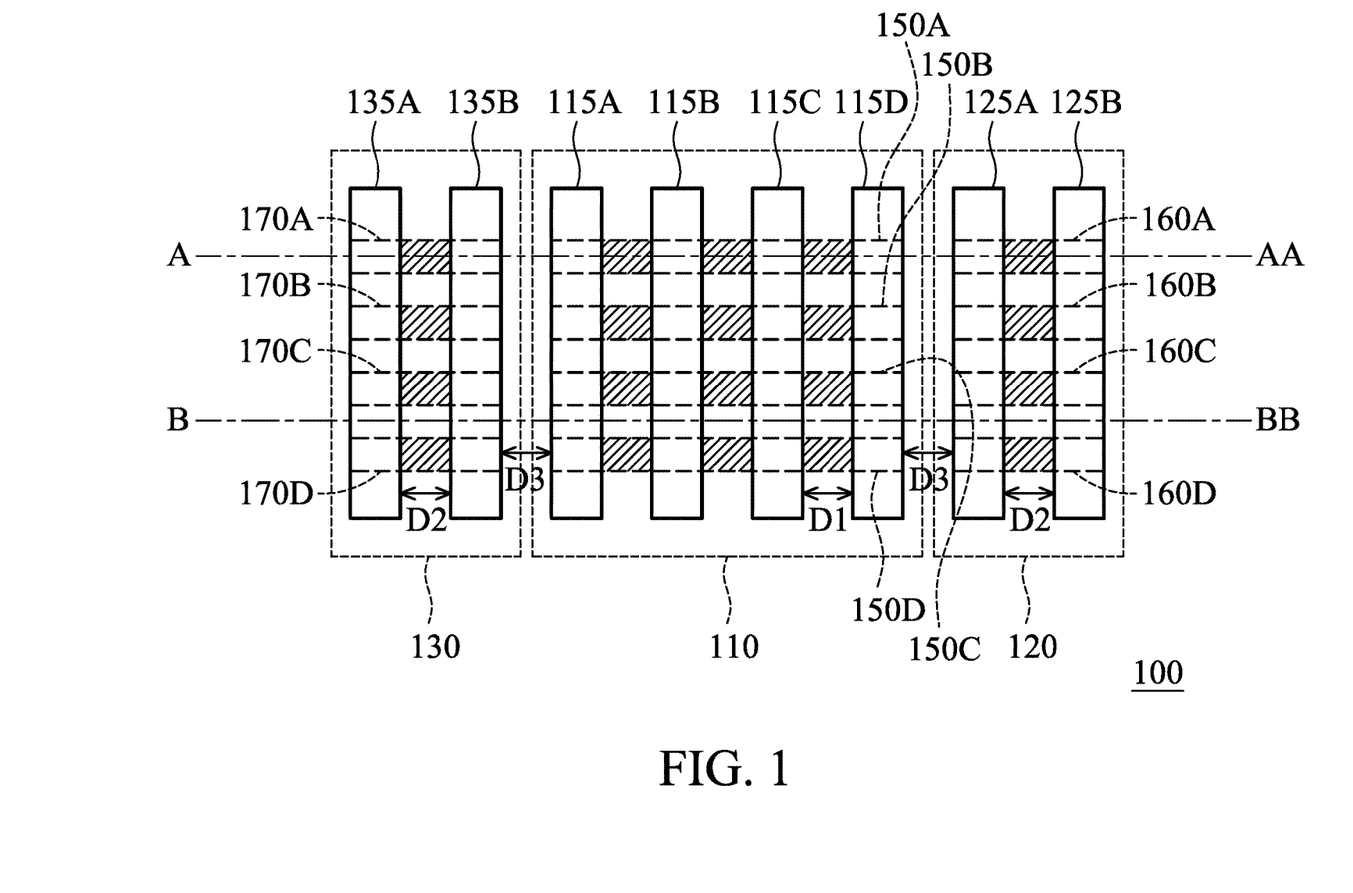
FIG. 1 shows a semiconductor structure of an integrated circuit (IC) according to an embodiment of the invention.

FIG. 1 shows a semiconductor structure 100 of an integrated circuit (IC) according to an embodiment of the invention. The semiconductor structure 100 comprises a radio frequency (RF) circuit 110, a guard ring 120 disposed on the right side of the RF circuit 110, and a guard ring 130 disposed on the left side of the RF circuit 110. In the RF circuit 110, the RF circuit 110 comprises at least one RF device, and the RF device is a FIN field-effect transistor (FET) formed by a plurality of polys 115A-115D and a plurality of fins 150A-150D. In some embodiments, the RF circuit 110 comprises a plurality of RF devices, and each RF device is a FIN FET. In the RF circuit 110, the polys 115A-115D are parallel to each other, and the fins 150A-150D are parallel to each other. Furthermore, the polys 115A-115D are perpendicular to the fins 150A-150D. In some embodiments, the distances D1 between two adjacent polys of the polys 115A-115D are the same. It should be noted that the number of polys and the fins in the RF circuit 110 are determined according to the actual design of the RF devices. The guard ring 120 comprises a pair of polys 125A and 125B and a plurality of fins 160A-160D. The polys 125A and 125B are parallel to the polys 115A-115D, and the polys 125A and 125B are perpendicular to the fins 160A-160D. Furthermore, the fins 150A-150D of the RF circuit 110 and the fins 160A-160D of the guard ring 120 are disposed on the same row lines, respectively. For example, the fins 150A and 160A are disposed on a first row line, the fins 150B and 160B are disposed on a second row line, the fins 150C and 160C are disposed on a third row line, and the fins 150D and 160D are disposed on a fourth row line. In some embodiments, the distance D1 between the two adjacent polys of the polys 115A-115D is the same as the distance D2 between the polys 125A and 125B, and the distance D2 between the polys 125A and 125B is the same as the distance D3 between the polys 115D and 125A. In order to reduce the area of the semiconductor structure 100, the guard ring 120 only comprises one pair of polys 125A and 125B, i.e. the number of polys in the guard ring is equal to 2. It should be noted that the number of polys in the RF circuit 110 is greater than the number of polys in the guard ring 120. Moreover, the number of fins (e.g. 160A-160D) in the guard ring 120 is determined according to the number of fins (e.g. 150A-150D) in the RF circuit 110. It should be noted that the conductive type of the fins 150A-150D in the RF circuit 110 is different from the conductive type of the fins 160A-160D in the guard ring 120. In FIG. 1, the fins 150A-150D of the RF circuit 110 are N+ doped fins, and the fins 160A-160D of the guard ring 120 are P+ doped fins.

Similarly, the guard ring 130 comprises a pair of polys 135A and 135B and a plurality of fins 170A-170D. The polys 135A and 135B are parallel to the polys 115A-115D, and the polys 135A and 135B are perpendicular to the fins 170A-170D. As described above, the fins 150A-150D of the RF circuit 110 and the fins 170A-170D of the guard ring 130 are disposed on the same row lines, respectively. In some embodiments, the guard rings 120 and 130 have the same configuration, and the distance D2 between the polys 135A and 135B is equal to the distance D2 between the polys 125A and 125B. Moreover, the distance D2 between the polys 135A and 135B is the same as the distance D3 between the polys 115A and 135A. In order to reduce the area of the semiconductor structure 100, the guard ring 130 only comprises the pair of polys 135A and 135B, i.e. the number of polys in the guard ring is equal to 2. It should be noted that the number of polys in the RF circuit 110 is greater than the number of polys in the guard ring 130. Moreover, the number of fins (e.g. 170A-170D) in the guard ring 130 is determined according to the number of fins (e.g. 150A-150D) in the RF circuit 110. In some embodiments, the lengths of the fins 170A-170D (e.g. from the left side of the poly 135A to the right side of the poly 135B) of the guard ring 130 are equal to the lengths (e.g. from the left side of the poly 125A to the right side of the poly 125B) of the fins 160A-160D of the guard ring 120. Furthermore, the lengths of the fins 170A-170D (e.g. from the left side of the poly 135A to the right side of the poly 135B) of the guard ring 130 are shorter than the lengths (e.g. from the left side of the poly 115A to the right side of the poly 115D) of the fins 150A-150D of the RF circuit 110. Moreover, the fins 150A-150D of the RF circuit 110 are N+ doped fins, and the fins 170A-170D of the guard ring 130 are P+ doped fins. In some embodiments, the guard rings 120 and 130 are coupled together to form a quadrangle, so as to surround (or encircle) the RF circuit 110.

Figure 2A:
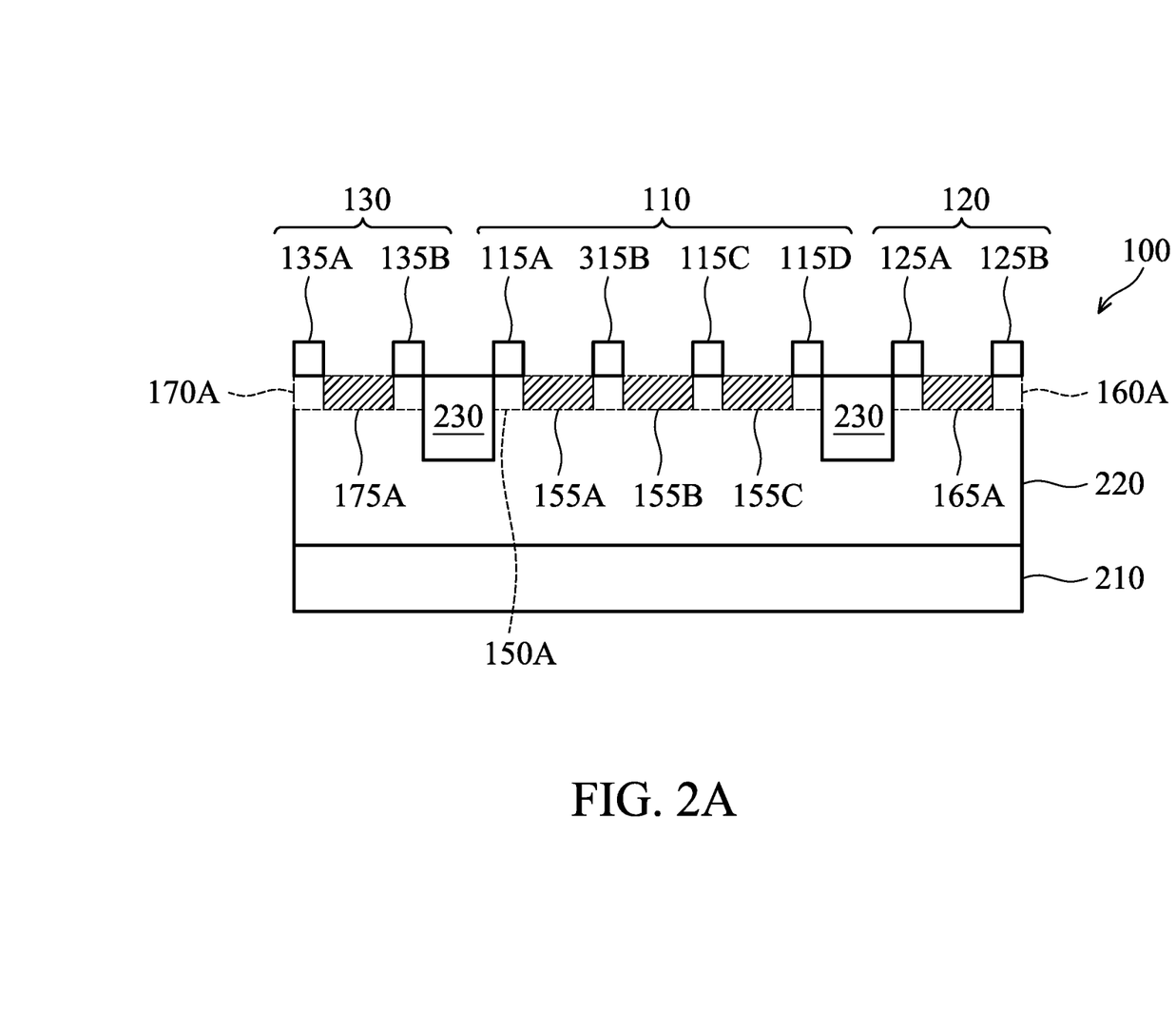
FIG. 2A shows a sectional view along line A-AA of the semiconductor structure of FIG. 1.

FIG. 2A shows a sectional view along line A-AA of the semiconductor structure 100 of FIG. 1. A P-type well 220 is disposed on a substrate 210, and the fins 170A, 150A and 160A are disposed on the P-type well 220. The fin 170A of the guard ring 130 is separated from the fin 150A of RF circuit 110 by an isolation region 230, such as shallow trench isolation (STI). Furthermore, the fin 160A of the guard ring 120 is separated from the fin 150A of RF circuit 110 by an isolation region 230. It should be noted that the isolation region 230 directly contact the fins 170A and 150A, and the isolation region 230 directly contact the fins 160A and 150A. Therefore, no active area or dummy active area is arranged between the guard ring 120 and the RF circuit 110 and between the guard ring 130 and the RF circuit 110. In one embodiment, three active areas 155A-155C of the fin 150A form the drain/source regions of the same FIN FET, and the active area 175A of the fin 170A and the active area 165A of the FIN 160A form the bulk regions of the same FIN FET. For example, if the active areas 155A and 155C form the drain regions of the FIN FET, the active area 155B forms the source region of the FIN FET, and the gate electrode of the FIN FET is coupled to the polys 115B and 115C. Conversely, if the active areas 155A and 155C form the source regions of the FIN FET, the active area 155B forms the drain region of the FIN FET, and the gate electrode of the FIN FET is coupled to the polys 115B and 115C. It should be noted that the polys 115A-115D do not overlap the active areas 155A-155C. In some embodiments, the three active areas 155A-155C form the drain/source regions of the different FIN FETs in the fin 150A. For example, if the active area 155A forms the drain region of a first FIN FET and the active area 155C forms the drain region of a second FIN FET, the active area 155B forms the source region of the first and second FIN FETs. Furthermore, the gate electrode of the first FIN FET is coupled to the poly 115B, and the gate electrode of the second FIN FET is coupled to the poly 115C. Conversely, if the active area 155A forms the source region of the first FIN FET and the active area 155C forms the source region of the second FIN FET, the active area 155B forms the drain region of the first and second FIN FETs. Furthermore, the gate electrode of the first FIN FET is coupled to the poly 115B, and the gate electrode of the second FIN FET is coupled to the poly 115C. Moreover, the active area 175A of the fin 170A and the active area 165A of the FIN 160A form the bulk regions of the first and second FIN FETs, i.e. the bulk regions of the first and second FIN FETs are coupled together.

Figure 2B:
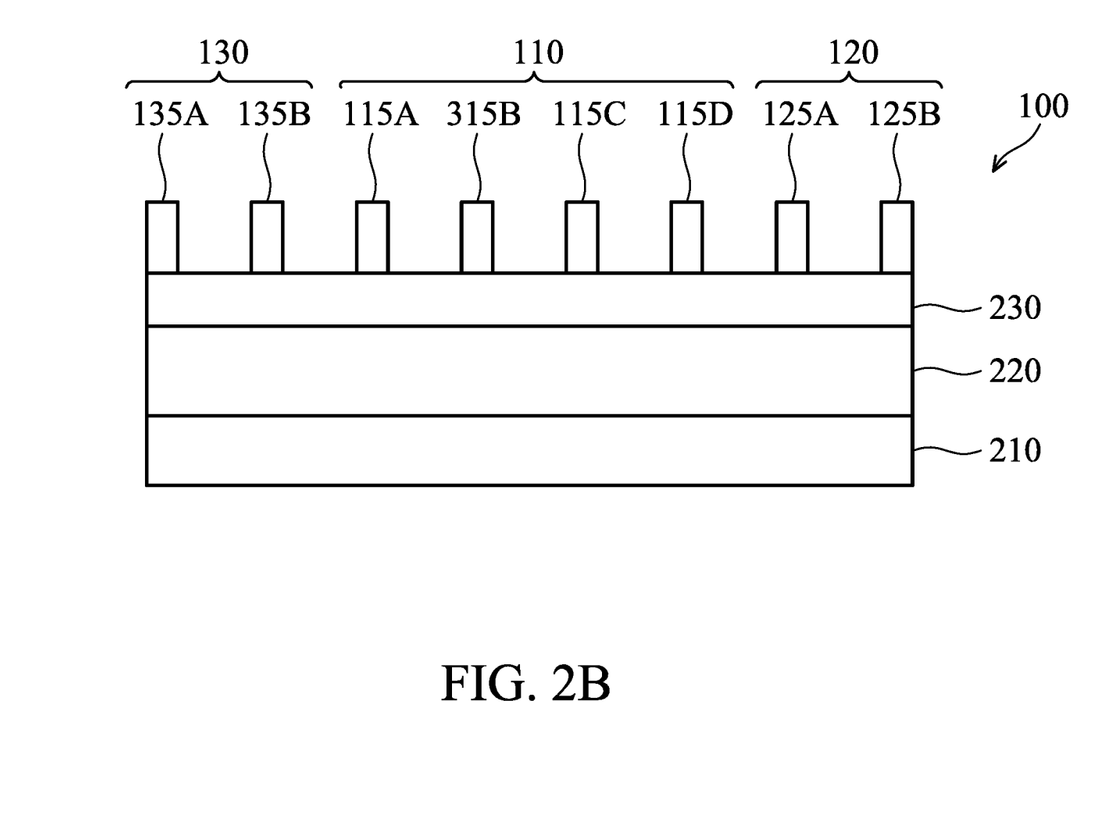
FIG. 2B shows a sectional view along line B-BB of the semiconductor structure of FIG. 1.

FIG. 2B shows a sectional view along line B-BB of the semiconductor structure 100 of FIG. 1. Similarly, the P-type well 220 is disposed on the substrate 210, and an isolation region 230 is disposed on the P-type well 220. Furthermore, the depth of the isolation region 230 of FIG. 2B is less than the depth of the isolation region 230 of FIG. 2A. Compared with FIG. 2A, due to there being no fin in line B-BB, the polys 135A-135B, 115A-115D, and 125A-125B have greater depth in FIG. 2B.

Figure 3:
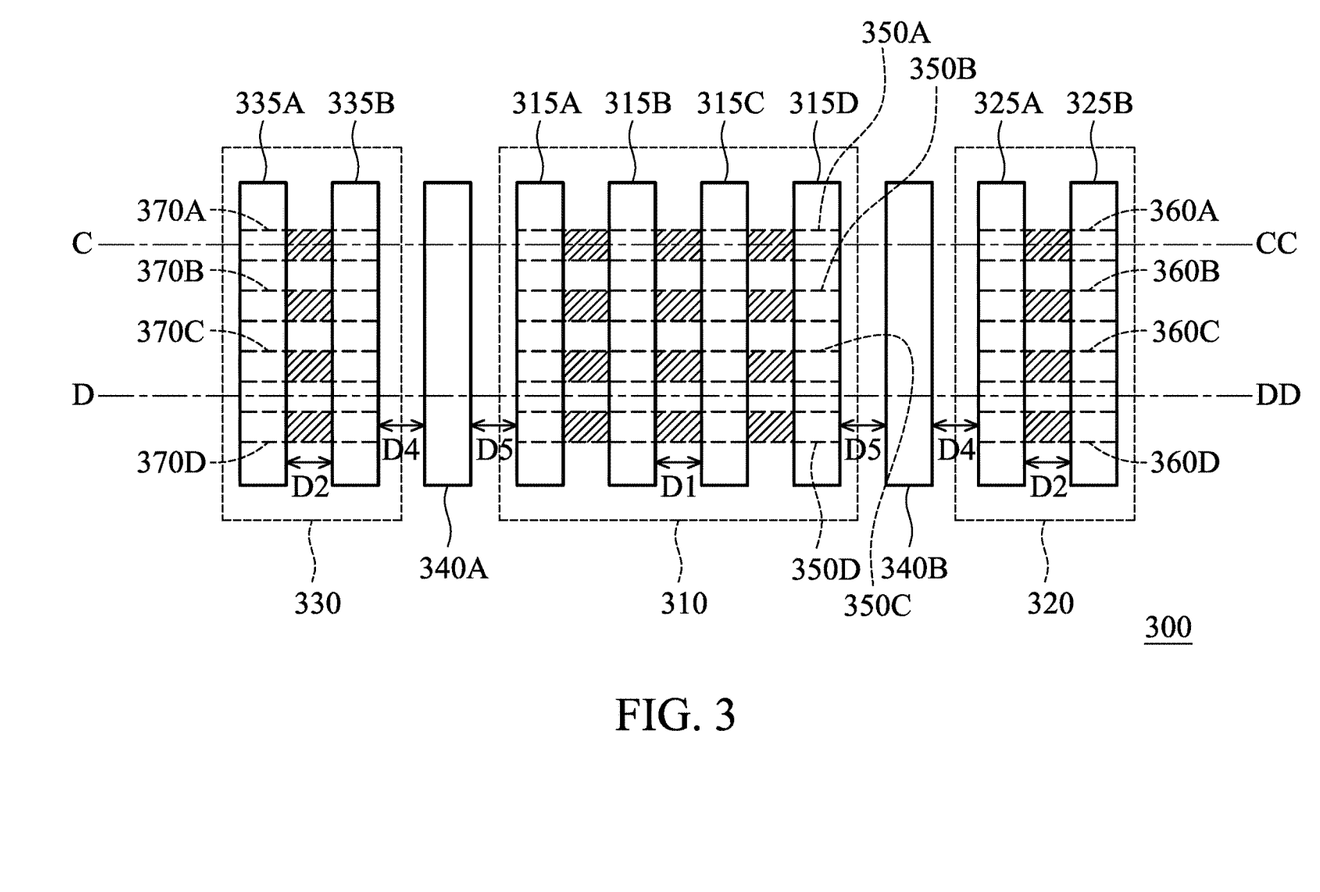
FIG. 3 shows a semiconductor structure of an IC according to another embodiment of the invention.

FIG. 3 shows a semiconductor structure 300 of an IC according to another embodiment of the invention. The semiconductor structure 300 comprises an RF circuit 310, a guard ring 320 disposed on the right side of the RF circuit 310, and a guard ring 330 disposed on the left side of the RF circuit 310. In the RF circuit 310, the RF circuit 310 comprises at least one RF device, and the RF device is a FIN FET formed by a plurality of polys 315A-315D and a plurality of fins 350A-350D. As described above, the polys 315A-315D are parallel to each other, and the fins 350A-350D are parallel to each other. Furthermore, the polys 315A-315D are perpendicular to the fins 350A-350D. As described above, the guard rings 320 and 330 have the same configure. Taking the guard ring 320 as an example for description, the guard ring 320 comprises a pair of polys 325A and 325B and a plurality of fins 360A-360D. The polys 325A and 325B are parallel to the polys 315A-315D, and the polys 325A and 325B are perpendicular to the fins 360A-360D. Furthermore, the fins 350A-350D of the RF circuit 310 and the fins 360A-360D of the guard ring 320 are disposed on the same row lines, respectively. For example, the fins 350A and 360A are disposed on a first row line, the fins 350B and 360B are disposed on a second row line, the fins 350C and 360C are disposed on a third row line, and the fins 350D and 360D are disposed on a fourth row line.

In order to reduce the area of the semiconductor structure 300, the guard rings 320 and 330 only comprises the pair of polys 325A and 325B and the pair of polys 335A and 335B, respectively. Specifically, the number of polys in the guard rings 320 and 330 is equal to 2. It should be noted that the number of polys in the RF circuit 310 is greater than the number of polys in the guard rings 320 and 330. Moreover, the number of fins (e.g. 360A-360D and 370A-370D) in the guard rings 320 and 330 are determined according to the number of fins (e.g. 350A-350D) in the RF circuit 310. In some embodiments, the lengths of the fins 370A-370D (e.g. from the left side of the poly 335A to the right side of the poly 335B) of the guard ring 330 are equal to the lengths (e.g. from the left side of the poly 325A to the right side of the poly 325B) of the fins 360A-360D of the guard ring 320. Furthermore, the lengths of the fins 370A-370D (e.g. from the left side of the poly 335A to the right side of the poly 335B) of the guard ring 330 are shorter than the lengths (e.g. from the left side of the poly 315A to the right side of the poly 315D) of the fins 350A-350D of the RF circuit 310. It should be noted that the conductive type of the fins 350A-350D in the RF circuit 310 is different from the conductive type of the fins 360A-360D in the guard ring 320. Furthermore, the conductive type of the fins 360A-360D in the guard ring 320 and the conductive type of the fins 370A-370D in the guard ring 330 are the same. In FIG. 3, the fins 350A-350D of the RF circuit 310 are N+ doped fins, and the fins 360A-360D of the guard ring 320 and the fins 370A-370D of the guard ring 330 are P+ doped fins. In some embodiments, the guard rings 320 and 330 are coupled together to form a quadrangle, so as to surround (or encircle) the RF circuit 310.

Compared with the semiconductor structure 100 of FIG. 1, the semiconductor structure 300 of FIG. 3 further comprises a dummy poly 340A disposed between the guard ring 330 and the RF circuit 310, and a dummy poly 340B disposed between the guard ring 320 and the RF circuit 310. The dummy polys 340A and 340B are arranged parallel to the polys 315A-315D of the RF circuit 310, the polys 325A-325B of the guard ring 320, and the polys 335A-335B of the guard ring 330. In some embodiments, a plurality of dummy polys 340A are disposed between the guard ring 330 and the RF circuit 310, and a plurality of dummy polys 340B are disposed between the guard ring 330 and the RF circuit 310. Furthermore, the number of dummy polys 340A is equal to that of the dummy polys 340B, so as to obtain a symmetrical layout. As described above, the distances D1 between the polys 315A-315D are the same. It should be noted that the number of polys and the fins in the RF circuit 310 are determined according to the actual design of the RF devices. Furthermore, the distance D1 between two adjacent polys of the polys 315A-315D is the same as the distance D2 of the polys 325A and 325B. Moreover, the distance D5 between the poly 315A of the RF circuit 310 and the dummy poly 340A is the same as the distance D4 between the poly 335b of the guard ring 330 and the dummy poly 340A. In some embodiments, the distances D1, D2, D4 and D5 are equal.

Figure 4A:
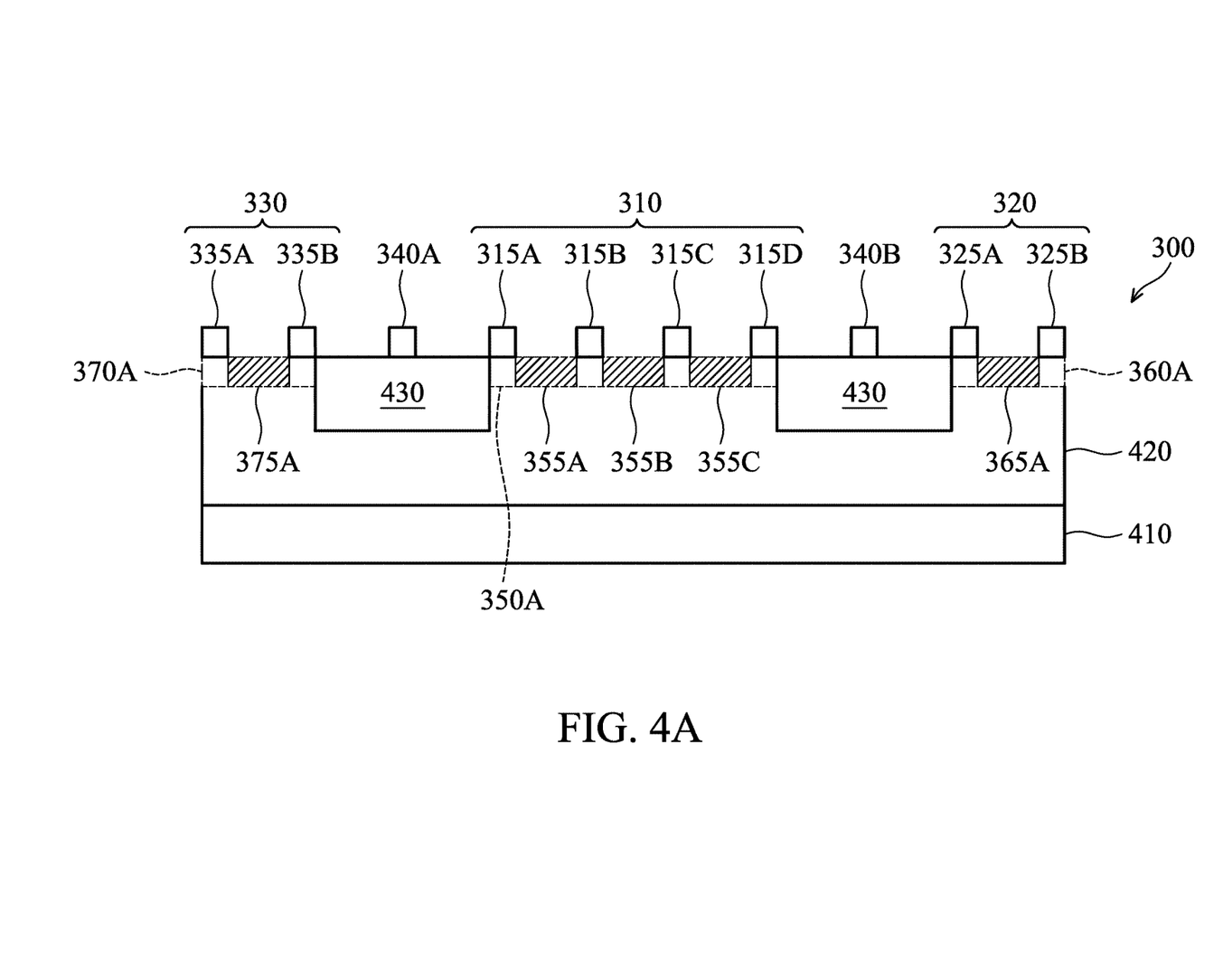
FIG. 4A shows a sectional view along line C-CC of the semiconductor structure of FIG. 3.

FIG. 4A shows a sectional view along line C-CC of the semiconductor structure 300 of FIG. 3. A P-type well 420 is disposed on a substrate 410, and the fins 370A, 350A and 360A are disposed on the P-type well 420. The fin 370A of the guard ring 330 is separated from the fin 350A of RF circuit 310 by an isolation region 430, such as shallow trench isolation (STI). Furthermore, the fin 360A of the guard ring 320 is separated from the fin 350A of RF circuit 310 by an isolation region 430. It should be noted that the isolation 430 directly contact the fins 370A and 350A, and the isolation 430 directly contact the fins 360A and 350A. Therefore, no active area or dummy active area is arranged between the guard ring 320 and the RF circuit 310 and between the guard ring 330 and the RF circuit 310. Furthermore, the dummy poly 340A is disposed on the isolation region 430 between the fins 370A and 350A, and the dummy poly 340A directly contacts the isolation region 430. Similarly, the dummy poly 340B is disposed on the isolation region 430 between the fins 360A and 350A, and the dummy poly 340B directly contacts the isolation region 430. As described above, the active areas are formed in the fin. For example, the three active areas 355A-355C of the fin 350A form the drain/source regions of the same FIN FET, and the active area 375A of the fin 370A and the active area 365A of the FIN 360A form the bulk regions of the same FIN FET. If the active areas 355A and 355C form the drain regions of the FIN FET, the active area 355B forms the source region of the FIN FET, and the gate electrode of the FIN FET is coupled to the polys 315B and 315C. Conversely, if the active areas 355A and 355C form the source regions of the FIN FET, the active area 355B forms the drain region of the FIN FET, and the gate electrode of the FIN FET is coupled to the polys 315B and 315C. It should be noted that the polys 315A-315D do not overlap the active areas 355A-355C. In some embodiments, the three active areas 355A-355C form the drain/source regions of the different FIN FETs in the fin 350A. For example, if the active area 355A forms the drain region of a first FIN FET and the active area 355C forms the drain region of a second FIN FET, the active area 355B forms the source region of the first and second FIN FETs. Furthermore, the gate electrode of the first FIN FET is coupled to the poly 315B, and the gate electrode of the second FIN FET is coupled to the poly 315C. Conversely, if the active area 355A forms the source region of the first FIN FET and the active area 355C forms the source region of the second FIN FET, the active area 355B forms the drain region of the first and second FIN FETs. Furthermore, the gate electrode of the first FIN FET is coupled to the poly 315B, and the gate electrode of the second FIN FET is coupled to the poly 315C. Moreover, the active area 375A of the fin 370A and the active area 365A of the FIN 360A form the bulk regions of the first and second FIN FETs, i.e. the bulk regions of the first and second FIN FETs are coupled together.

Figure 4B:
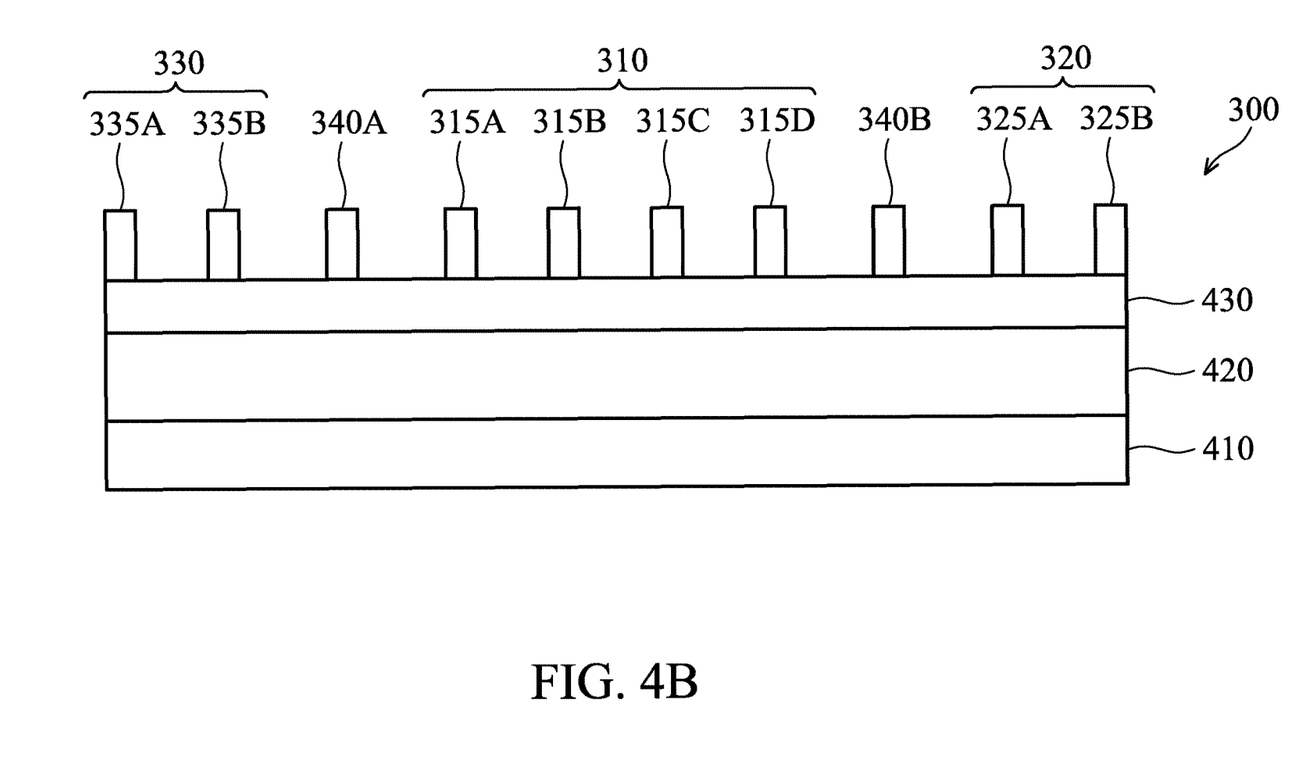
FIG. 4B shows a sectional view along line D-DD of the semiconductor structure of FIG. 3.

FIG. 4B shows a sectional view along line D-DD of the semiconductor structure 300 of FIG. 3. Similarly, the P-type well 420 is disposed on the substrate 410, and an isolation region 430 is disposed on the P-type well 420. Furthermore, the depth of the isolation region 430 of FIG. 4B is less than the depth of the isolation region 430 of FIG. 4A. Compared with FIG. 4A, due to there being no fin in line D-DD, the polys 335A-335B, 315A-315D, and 325A-325B, and the dummy polys 340A-340B have greater depth in FIG. 4B.

According to the embodiments, by arranging the guard rings on both opposite sides of the RF circuit, noise or interference can be decreased for the RF circuit. Furthermore, arranging the guard ring next to the RF circuit, i.e., the fins of the guard ring and the fins of the RF circuit are separated by the isolation regions, the area of the semiconductor structure is decreased, and thus manufacturing cost of the IC is decreased.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
    a semiconductor substrate;
    a well region on the semiconductor substrate, having a first conductive type;
    a radio frequency (RF) circuit, comprising at least one FIN field-effect transistor having a plurality of first fins and a plurality of first polys on the well region, wherein the first polys are perpendicular to the first fins;
    a first guard ring adjacent to the RF circuit, comprising a plurality of second fins and a pair of second polys on the well region, wherein the second polys are perpendicular to the second fins; and
    a first isolation region directly disposed between the RF circuit and the first guard ring,
    wherein the first fins are arranged parallel to the second fins, and the first fins are separated from the second fins by the first isolation region.

2. The semiconductor structure as claimed in claim 1, wherein the first polys are arranged parallel to the second polys.

3. The semiconductor structure as claimed in claim 2, wherein the number of first fins is equal to the number of second fins.

4. The semiconductor structure as claimed in claim 3, wherein each of the first fins comprises a plurality of first active areas having a second conductive type, and each of the second fins comprises a second active area having the first conductive type.

5. The semiconductor structure as claimed in claim 1, further comprising:
    a dummy poly on the first isolation region,
    wherein the first and second polys and the dummy poly are arranged parallel to each other.

6. The semiconductor structure as claimed in claim 5, wherein a distance between the dummy poly and one of the first polys is equal to a distance between the dummy poly and the second poly adjacent to the one of the first polys.

7. The semiconductor structure as claimed in claim 1, further comprising:
    a second guard ring adjacent to the RF circuit, comprising a plurality of third fins and a pair of third polys on the well region, wherein the third polys are perpendicular to the third fins; and
    a second isolation region directly disposed between the RF circuit and the second guard ring,
    wherein the number of third fins is equal to the number of second fins,
    wherein length of each of the third fins is equal to that of the second fin, and the length of each of the third fins is shorter than that of the first fin.

8. The semiconductor structure as claimed in claim 1, wherein the first guard ring forms a bulk region of the FIN field-effect transistor.

9. The semiconductor structure as claimed in claim 1, wherein the number of first polys is greater than the number of second polys.

10. A semiconductor structure, comprising:
    a semiconductor substrate;
    a well region on the semiconductor substrate, having a first conductive type;
    a radio frequency (RF) circuit, comprising at least one FIN field-effect transistor having a plurality of first fins and a plurality of first polys on the well region, wherein the first fins have a second conductive type, and the first polys are perpendicular to the first fins;
    a pair of guard rings disposed on both opposite sides of the RF circuit, wherein each of the guard rings comprises a plurality of second fins and a pair of second polys on the well region, wherein the second fins have the first conductive type, and the second polys are perpendicular to the second fins;
    a first isolation region on the well region, wherein the first isolation region is directly disposed between the RF circuit and one of the guard rings; and
    a second isolation region on the well region, wherein the second isolation region is directly disposed between the RF circuit and the other guard ring;
    wherein the first fins are arranged parallel to the second fins, and the first fins are separated from the second fins by the first and second isolation regions.

11. The semiconductor structure as claimed in claim 10, wherein each of the first and second isolation regions directly contacts the first fins and the second fins.

12. The semiconductor structure as claimed in claim 10, wherein distance between the two adjacent first polys is equal to distance between the two adjacent second polys.

13. The semiconductor structure as claimed in claim 10, wherein the number of first fins is equal to the number of second fins in each of the guard rings.

14. The semiconductor structure as claimed in claim 10, wherein the number of first polys is greater than the number of second polys in each of the guard rings.

15. The semiconductor structure as claimed in claim 10, further comprising:
    a first dummy poly on the first isolation region; and
    a second dummy poly on the second isolation region,
    wherein the first and second dummy polys are arranged parallel to the first and second polys.

16. The semiconductor structure as claimed in claim 15, wherein the first and second dummy polys overlap the first and second isolation regions, respectively.

17. The semiconductor structure as claimed in claim 15, wherein a distance between the first dummy poly and one of the first polys adjacent to the first isolation region is equal to a distance between the first dummy poly and the second poly adjacent to the first isolation region, and a distance between the second dummy poly and one of the first polys adjacent to the second isolation region is equal to a distance between the second dummy poly and the second poly adjacent to the second isolation region.

18. The semiconductor structure as claimed in claim 10, wherein each of the first fins comprises a plurality of first active areas having the second conductive type, and the first active areas form drain regions and source regions of the FIN field-effect transistor.

19. The semiconductor structure as claimed in claim 10, wherein each of the second fins comprises a second active area having the first conductive type, and the second active area forms a bulk region of the FIN field-effect transistor.

20. The semiconductor structure as claimed in claim 10, wherein length of each of the second fins is shorter than that of the first fin.

* * * * *